(12) United States Patent
Harris et al.

(10) Patent No.: US 8,674,390 B2
(45) Date of Patent: Mar. 18, 2014

(54) SEMICONDUCTOR NANOPARTICLE-CONTAINING MATERIALS AND LIGHT EMITTING DEVICES INCORPORATING THE SAME

(75) Inventors: James Harris, Manchester (GB); Imad Naasani, Manchester (GB); Nigel Picket, Manchester (GB)

(73) Assignee: Nanoco Technologies Ltd. (GB)

( * ) Notice: Subject to any disclaimer, the term of this patent is extended or adjusted under 35 U.S.C. 154(b) by 0 days.

(21) Appl. No.: 13/485,275

(22) Filed: May 31, 2012

(65) Prior Publication Data

US 2013/0140600 A1    Jun. 6, 2013

Related U.S. Application Data

(60) Provisional application No. 61/493,725, filed on Jun. 6, 2011.

(30) Foreign Application Priority Data

May 31, 2011    (GB) .................................. 1109065.1

(51) Int. Cl.
*H01L 33/00*    (2010.01)
*H01L 21/00*    (2006.01)

(52) U.S. Cl.
USPC ................. 257/98; 257/100; 438/26; 438/27; 438/29; 438/31

(58) Field of Classification Search
USPC .................................. 257/79–103; 438/22–47
See application file for complete search history.

(56) References Cited

U.S. PATENT DOCUMENTS

| | | | |
|---|---|---|---|
| 2004/0178417 A1* | 9/2004 | Andrews | 257/93 |
| 2007/0029569 A1* | 2/2007 | Andrews | 257/99 |
| 2008/0048200 A1* | 2/2008 | Mueller et al. | 257/98 |
| 2010/0065861 A1* | 3/2010 | Nagai | 257/88 |
| 2010/0224831 A1* | 9/2010 | Woo et al. | 252/301.6 S |
| 2011/0039358 A1* | 2/2011 | Ling | 438/27 |

* cited by examiner

*Primary Examiner* — Fernando L Toledo
*Assistant Examiner* — Karen Kusumakar
(74) *Attorney, Agent, or Firm* — Wong, Cabello, Lutsch, Rutherford & Brucculeri LLP.

(57) ABSTRACT

In various embodiments, the present invention provides a light emitting device cap configured for location on a light emitting device comprising or consisting essentially of a primary light source. The cap defines a well region within which is received a population of semiconductor nanoparticles such that the semiconductor nanoparticles are in optical communication with the primary light source of the light emitting device when the cap is located on the light emitting device. There is further provided a light emitting device comprising or consisting essentially of a primary light source and such a cap, as well as methods for fabricating such a cap and device.

17 Claims, 5 Drawing Sheets

SEMICONDUCTOR NANOPARTICLE-CONTAINING MATERIALS AND LIGHT EMITTING DEVICES INCORPORATING THE SAME

CROSS-REFERENCE TO A RELATED APPLICATION

This is a non-provisional application which claims priority to provisional application 61/493,725, filed Jun. 6, 2011, which claims priority to Great Britain application 1109065.1, filed May 31, 2011, the contents of each of these applications are incorporated herein by reference.

FIELD OF THE INVENTION

Embodiments of the present invention relate to semiconductor nanoparticle-based materials for use in light emitting devices, such as, but not limited to, light emitting diodes (LEDs). Embodiments of the present invention further relate to light emitting devices incorporating semiconductor nanoparticle-containing materials. Particularly, but not exclusively, Embodiments of the present invention relate to a protective cap incorporating quantum dots (QDs) for use in the fabrication of QD-based light emitting devices, methods for producing said cap, processes for fabricating such devices employing said cap and the devices thus formed.

BACKGROUND

Light-emitting diodes (LEDs) are likely to become ubiquitous across all manner of lighting, signaling and display applications in modern day life. Applications in liquid crystal display (LCD) backlighting and general lighting are expected to become the mainstream in the coming decade. Currently, LED devices are made from inorganic solid-state compound semiconductors, such as AlGaAs (red), AlGaInP (orange-yellow-green), and AlGaInN (green-blue), however, using a mixture of the available solid-state compound semiconductors, solid-state LEDs which emit white light are difficult to produce.

Figure 1:
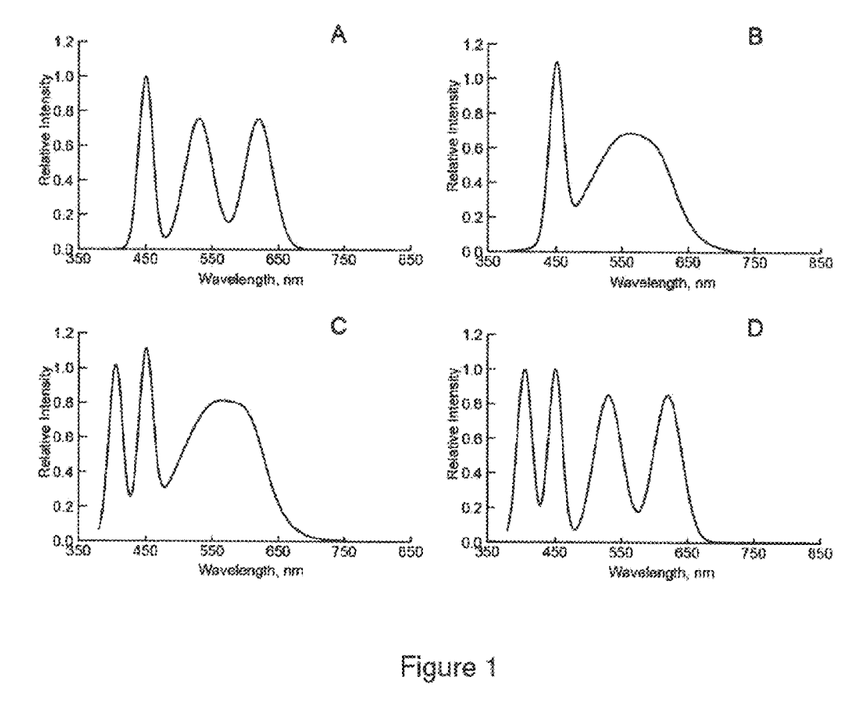
FIG. 1 shows a series of schematic graphs illustrating different strategies for combining LEDs with color converting materials to produce white light. A: blue LED combined with green and red color conversion materials; B: blue LED combined with broad yellow color conversion material; C: UV-LED combined with blue and broad yellow color conversion materials; and D: UV-LED combined with blue, green and red color conversion materials.

Many strategies to emit white light are based upon combining blue, green and red light in such a way as to stimulate the eye such that white light is perceived. This may be done with dichromatic, trichromatic or polychromatic light sources. In the case of LEDs it may be achieved by combining multiple LEDs that emit blue, green and red in the correct intensity ratios or by combining blue or UV-LEDs with appropriate color conversion materials. In this case the color conversion material is placed on top of the solid-state LED whereby the light from the LED (the "primary light") is absorbed by the color conversion material and then re-emitted at a different frequency (the "secondary light"), i.e. the color conversion materials down convert the primary light to the secondary light. In the case of using LEDs combined with color converter materials there are a number of strategies that may be used such as a dichromatic solution whereby a blue LED is combined with a broad yellow emitting material, or a trichromatic solution whereby a blue LED is combined with broad green/yellow and red emitting converter materials. This may be extended to UV-LEDs by including a further blue emitting converter material to both solutions. Simulated spectra of white of white di-, tri- and quad-chromatic light sources are shown in FIG. 1.

Although it is possible to produce white light by combining the light from individual red, green and blue LEDs the use of white LEDs produced using color conversion materials gives advantages such as lower numbers of LEDs being used and simpler circuitry design. Consequences of this include simpler device fabrication and ultimately lower cost.

There are many known color converter materials including phosphors, semiconductors, dyes and more recently semiconductor QDs. The materials in most prevalent use are phosphors which consist essentially of an inorganic host material doped with an optically active element. Common host materials are nitrides, oxides, oxynitrides, halophosphates, garnets, etc. and among the large amount of host materials available the garnets are of particular importance and within the garnet group yttrium aluminium garnet is a particularly common host material. The optically active dopant is typically a trivalent rare-earth element, oxide or other rare-earth compound, for example europium (Eu), cerium (Ce) and terbium (Tb).

White LEDs made by combining a blue LED with a broad yellow phosphor may be very efficient, however, there are problems such as color control and color rendering due to a lack of tunability of the LEDs and the phosphor. Color control refers to the final color of the LED when the LED light is combined with the emission of the phosphor. This color is inherently limited by the emission spectrum of the phosphor which is not particularly tunable by composition. In order to change the color of the LED a different phosphor material is necessary. Color rendering refers to the ability of the light source to illuminate objects such that the color that appear is rendered correctly or as similarly as it would appear if the object were illuminated with a blackbody radiator of the same color temperature as the LED light source. Again this is limited by the emission spectrum of the phosphor since to date no one phosphor material can emit light such that the spectrum of a black body radiator can be mimicked exactly so usually a combination of phosphors are necessary and typically the color rendering performance is compromised in favour of luminous performance. Typically blue LEDs combined with broad yellow phosphors have a color rendering index (CRI) of less than 75 and only increase to about 85 when combined with an additional red phosphor. By definition a black body radiator with a color temperature the same as the test LED has a CRI of 100. More recently LEDs combining a broad yellow/green phosphor with red QDs has produced CRIs above 90. Achieving high CRIs is made possible by the use of QD color conversion materials because of the inherent tunability which allows the emission wavelength to be matched with the emission of a broad phosphor to produce light with a high CRI value.

There has been substantial interest in exploiting the properties of compound semiconductors consisting of particles with dimensions in the order of 2-50 nm, often referred to as quantum dots (QDs) or nanocrystals. These materials are of commercial interest due to their size-tuneable electronic properties which may be exploited in many commercial applications such as optical and electronic devices and other applications ranging from biological labeling, photovoltaics, catalysis, biological imaging, LEDs, general space lighting and electroluminescent displays amongst many new and emerging applications.

The most studied of semiconductor materials have been the chalcogenides II-VI materials namely ZnS, ZnSe, CdS, CdSe, CdTe; most noticeably CdSe due to its tuneability over the visible region of the spectrum. Reproducible methods for the large scale production of these materials have been developed from "bottom up" techniques, whereby particles are prepared atom-by-atom, i.e. from molecules to clusters to particles, using "wet" chemical procedures.

Two fundamental factors, both related to the size of the individual semiconductor nanoparticle, are at least in part responsible for their unique properties. The first is the large surface to volume ratio; as a particle becomes smaller, the ratio of the number of surface atoms to those in the interior increases. This leads to the surface properties playing an important role in the overall properties of the material. The second factor being, with many materials including semiconductor nanoparticles, that there is a change in the electronic properties of the material with size, moreover, because of quantum confinement effects the band gap gradually becomes larger as the size of the particle decreases. This effect is a consequence of the confinement of an 'electron in a box' giving rise to discrete energy levels similar to those observed in atoms and molecules, rather than a continuous band as observed in the corresponding bulk semiconductor material. Thus, for a semiconductor nanoparticle, because of the physical parameters, the "electron and hole", produced by the absorption of electromagnetic radiation, a photon, with energy greater than the first excitonic transition, are closer together than they would be in the corresponding macrocrystalline material, moreover the Coulombic interaction cannot be neglected. This leads to a narrow bandwidth emission, which is dependent upon the particle size and composition of the nanoparticle material. Thus, QDs have higher kinetic energy than the corresponding macrocrystalline material and consequently the first excitonic transition (band gap) increases in energy with decreasing particle diameter.

Core semiconductor nanoparticles, which consist essentially of a single semiconductor material along with an outer organic passivating layer, tend to have relatively low quantum efficiencies due to electron-hole recombination occurring at defects and dangling bonds situated on the nanoparticle surface which may lead to non-radiative electron-hole recombinations. One method to eliminate defects and dangling bonds on the inorganic surface of the OD is to grow a second inorganic material, having a wider band-gap and small lattice mismatch to that of the core material epitaxially on the surface of the core particle, to produce a "core-shell" particle. Core-shell particles separate any carriers confined in the core from surface states that would otherwise act as non-radiative recombination centers. One example is a ZnS shell grown on the surface of a CdSe core. Another approach is to prepare a core-multi shell structure where the "electron-hole" pair is completely confined to a single shell layer consisting essentially of a few mono layers of a specific material such as a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few mono layers of HgS which is then over grown by a monolayer of CdS. The resulting structures exhibit clear confinement of photo-excited carriers in the HgS layer. To add further stability to QDs and help to confine the electron-hole pair one of the most common approaches is by epitaxially growing a compositionally graded alloy layer on the core to alleviate strain that could otherwise led to defects. Moreover for a CdSe core in order to improve structural stability and quantum yield, rather growing a shell of ZnS directly on the core a graded alloy layer of $Cd_{1-x}Zn_xSe_{1-y}S_y$ may be used. This has been found to greatly enhance the photoluminescence emission of the QDs.

There have been two different approaches to using QDs as color converting materials in LEDs, direct addition and as remote phosphors.

Rudimentary QD-based light emitting devices based upon the direct addition principle have been made by embedding colloidally produced QDs in an optically clear LED encapsulation medium, typically a silicone or an epoxy, which is then placed in the well of the package over the top of the LED chip. The use of QDs potentially has some significant advantages over the use of the more conventional phosphors, such as the ability to tune the emission wavelength, strong absorption properties and low scattering if the QDs are mono-dispersed.

For the commercial application of QDs in next-generation light emitting devices, the QDs are preferably incorporated into the LED and in to the encapsulating material in such a way so that they remain as fully mono-dispersed as possible and do not suffer significant loss of quantum efficiency. Problems that QDs face in direct addition LEDs include a) photo-oxidation, b) temperature instability, and c) loss of quantum yield with increasing temperature.

Existing methods developed to date to address photo-oxidation are problematic, not least because of the nature of current LED encapsulants which are porous to oxygen and moisture, allowing oxygen to migrate to the surfaces of the QDs, which may lead to photo-oxidation and, as a result, a drop in quantum yield (QY). Furthermore, QDs may agglomerate when formulated into current LED encapsulants thereby reducing the optical performance.

Concerning heat degradation, QDs are stable to temperatures up to known threshold temperatures depending upon the type of QD whereby ligands desorb from the surface and/or reactions with the resin material and air start to occur. In situations whereby ligand loss occurs, if this is ligand loss is irreversible then the QDs will be irreversibly damaged.

Temperature of operation may affect the performance of the QDs because photoluminescence efficiencies decrease with increasing temperatures. Typically the hottest place within the LED package is located at the LED junction. Often the junction temperature may be much hotter than the surrounding package.

Although reasonably efficient QD-based light emitting devices may be fabricated under laboratory conditions building on current published methods and taking into account the three key issues discussed above, there remain significant challenges to develop materials and methods for fabricating QD-based light emitting devices under commercial conditions on an economically viable scale.

With regard to the use of QDs as remote phosphor color converting materials in LEDs, devices have been developed in which the QDs are embedded into an optically clear medium, typically in the form of a sheet or strip. The requirements for the optically clear medium are similar to those for direct addition in that the QDs are preferably fully dispersible in the optically clear medium and suffer little loss of quantum efficiency.

The QDs face similar problems in phosphor sheet materials as in devices based upon the direct addition principle, i.e. photo-oxidation, temperature instability and loss of quantum yield with increasing temperature as discussed above. Furthermore, problems arise from the remote phosphor format itself such as a) light trapping from waveguiding in the sheet type structure reducing performance, b) high material usage and c) lower performance than direct LEDs depending on distance from the LED light source.

SUMMARY AND DETAILED DESCRIPTION

Embodiments of the present invention obviate or mitigate one or more of the problems with current methods for fabricating semiconductor nanoparticle or quantum dot-based light emitting devices.

According to a first aspect, embodiments of the present invention provide a light emitting device cap configured for location on a light emitting device comprising or consisting essentially of a primary light source, the cap defining a well region within which is received a population of semiconductor nanoparticles such that the semiconductor nanoparticles are in optical communication with the primary light source of the light emitting device when the cap is located on the light emitting device.

By using an LED cap in combination with QDs, a QD based LED light source may be manufactured that exhibits good performance and extended lifetimes compared to prior art devices. The use of the cap typically averts many of the problems detailed above suffered by QD based solutions such as direct addition LEDs and remote phosphor sheets. The LED cap acts as an oxygen barrier, locates the QDs away from the LED junction where operating temperatures are lower and may be applied after any deleterious heat treatments have been carried out in device manufacturing. Optical lens design may be incorporated into the cap to maximize performance and the cap may be made to fit multiple LEDs either in arrays or strings.

The well region may be at least partly defined by a recess in the cap, or at least partly defined by an area of the cap bulk material, or defined in part by a recess in the cap and in part by an area of the cap bulk material.

Preferably the well region of the cap has at least one boundary that is configured, such that in use, the boundary is approximately aligned with a boundary of a region of the light emitting device exposed to light emitted by said primary light source. By way of example, the size and/or shape of the well in the cap may be such that it substantially mirrors the well in the LED, consequently material usage will be similar to direct addition LEDs and much lower than remote phosphor-based LEDs.

The cap bulk material, i.e. the bulk material from which the cap is formed, preferably comprises or consists essentially of a material selected from the group consisting of a silicone, an epoxy, a silica glass, a silica gel, a siloxane, a sol gel, a hydrogel, an agarose, a cellulose, a polyether, a polyethylene, a polyvinyl, a poly-diacetylene, a polyphenylene-vinylene, a polystyrene, a polypyrrole, a polyimide, a polyimidazole, a polysulfone, a polythiophene, a polyphosphate, a poly(meth) acrylate, a polyacrylamide, a polypeptide, a polysaccharide, and combinations thereof.

The semiconductor nanoparticles incorporated into the cap may contain ions selected from group 11, 12, 13, 14, 15 and/or 16 of the periodic table, and/or said semiconductor nanoparticles may contain one or more types of transition metal ion or d-block metal ion. Said semiconductor nanoparticles may contain one or more semiconductor material selected from the group consisting of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, and combinations thereof. The semiconductor nanoparticles are preferably quantum dots (QDs).

At least a portion of said population of semiconductor nanoparticles may be incorporated into a plurality of discrete microbeads. In a preferred embodiment some of the semiconductor nanoparticles are encapsulated within microbeads and some others are not encapsulated within microbeads. In a further preferred embodiment, substantially all of the semiconductor nanoparticles are encapsulated within microbeads, while in an alternative preferred embodiment all of the semiconductor nanoparticles are unencapsulated, i.e. not encapsulated within microbeads.

In a second aspect, embodiments of the present invention provide a light emitting device cap configured for location on a light emitting device comprising or consisting essentially of a primary light source, the cap defining a well region for receipt of a population of semiconductor nanoparticles such that the semiconductor nanoparticles are in optical communication with the primary light source of the light emitting device when the cap is located on the light emitting device.

Any of the preferred embodiments of the first aspect may be applied to the second aspect.

In a third aspect, embodiments of the present invention provide a light emitting device comprising or consisting essentially of a primary light source and a cap located on said light emitting device, the cap defining a well region within which is received a population of semiconductor nanoparticles in optical communication with the primary light source of the light emitting device.

Any of the preferred embodiments of the first aspect may be applied to the third aspect. The cap forming part of the third aspect may be in accordance with anyone or more of the preferred embodiments of the cap according to embodiments of the first aspect of the present invention.

The primary light source employed in anyone or more of the first, second and third aspects may be selected from the group consisting of a light emitting diode, a laser, an arc lamp, and a black-body light source. The primary light source is preferably a light emitting diode.

In a fourth aspect, embodiments of the present invention provide a method of fabricating a light emitting device cap configured for location on a light emitting device comprising or consisting essentially of a primary light source, the cap defining a well region within which is received a population of semiconductor nanoparticles such that the semiconductor nanoparticles are in optical communication with the primary light source of the light emitting device when the cap is located on the light emitting device, the method comprising or consisting essentially of depositing a formulation incorporating said semiconductor nanoparticles into said well region of the cap.

Said formulation is preferably cured after deposition of the formulation into said well region of the cap.

At least one further semiconductor nanoparticle-containing formulation may be deposited into said well region after deposition of said formulation of semiconductor nanoparticles. In this way, a composite or layer structure may be built up within the well region of the cap so as to modify the optical properties of the cap and, thereby, the light emitting device. Various examples are described below. By way of example, the formulations may contain populations of semiconductor nanoparticles which differ in respect of the size and/or composition of the semiconductor nanoparticles present in the formulations.

In a fifth aspect, embodiments of the present invention provide a method of fabricating a semiconductor nanoparticle-based light emitting device comprising or consisting essentially of locating a cap defining a well region within which is received a population of semiconductor nanoparticles on a light emitting device such that said semiconductor nanoparticles are in optical communication with the primary light source of the light emitting device.

The cap is preferably fabricated by depositing a formulation incorporating said semiconductor nanoparticles into said well region of the cap before locating the cap on the light emitting device.

Figure 3:
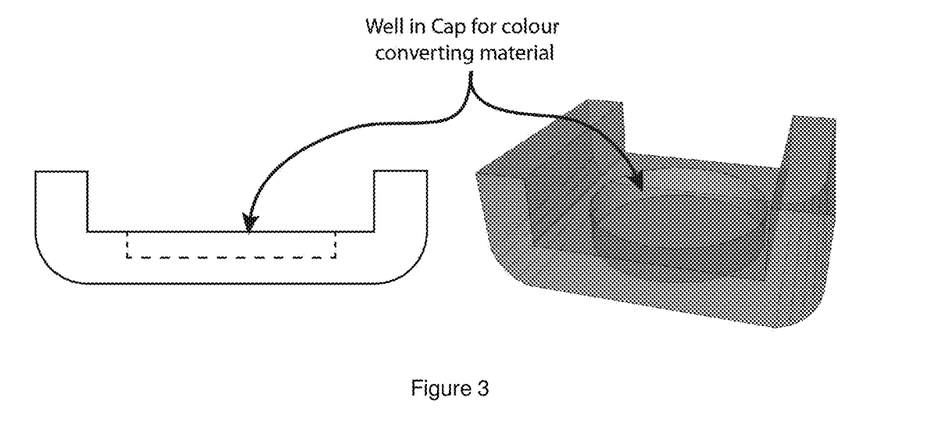
FIG. 3 shows two schematic representations of an LED cap in accordance with a preferred embodiment of the present invention. The left hand image is a cross-sectional view and the right hand image is an upper perspective view.
Figure 4:
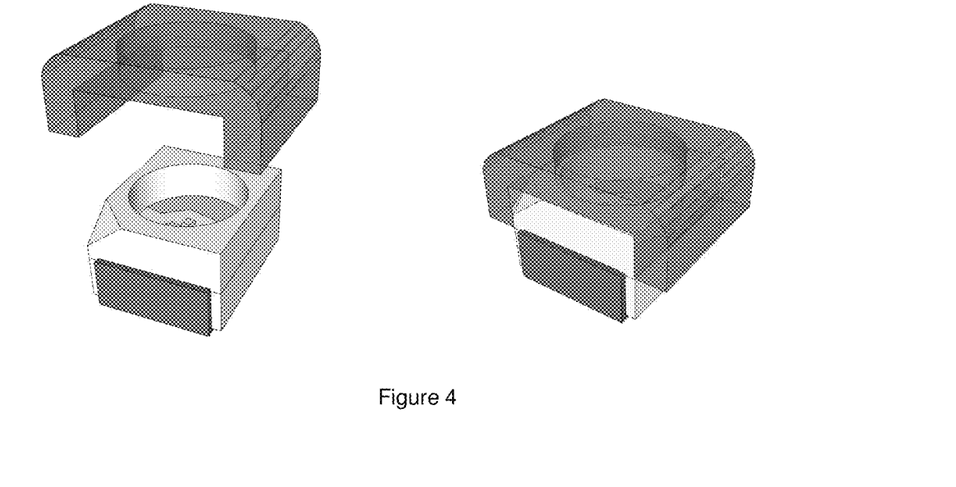
FIG. 4 shows two schematic representations of an LED cap being located on top of a conventional LED package in accordance with a preferred embodiment of the present invention. The left hand image is an upper perspective view of the cap before being located on the LED package and the right hand image is an upper perspective view of the cap after having been located on the LED package.
Figure 5:
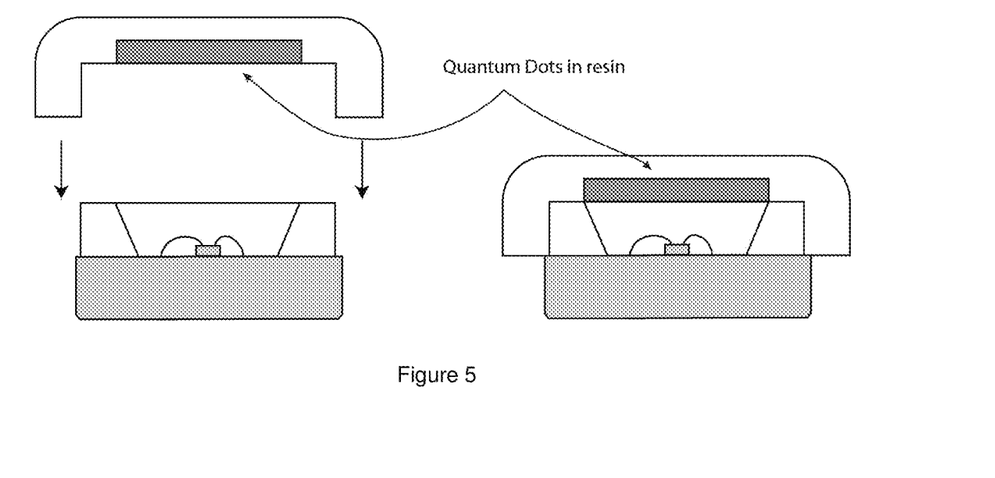
FIG. 5 shows two cross-sectional schematic representations of a QD-containing LED cap being located on top of a conventional LED package in accordance with a preferred embodiment of the present invention. The left hand image is a cross-sectional view of the cap before being located on the LED package and the right hand image is a cross-sectional view of the cap after having been located on the LED package.

The cap preferably includes or consists essentially of a piece of optically transparent material (e.g. a plastic, glass, ceramic, or any other suitable material) which is engineered in such a way as to be able to fit over the top of an LED package. Inside the cap is defined a well which receives the color converting (e.g. QD) material and is located so that when the cap is fitted on to the LED package the cap well is directly in the light path of light emitted from the LED chip. In a preferred embodiment, a color converting material dispersed in an appropriate resin (epoxy, silicone, acrylate etc.) is dispensed into the cap well and then cured. It is preferred that the sides of the LED cap are arranged such the when the cap is fitted onto the package they fit tightly on the edge of the LED package and provide structural support. Two dimensional and three-dimensional schematic drawings of an exemplary LED cap and how it may be fitted onto an LED package are shown in FIGS. 3 to 5.

Embodiments of the present invention enable better processing; the QD-containing cap may be made to fit the package of any LED currently employed and supplied to commercial manufacturers to retro-fit. Moreover, the QD-containing caps are generally in a form that is compatible with the existing LED fabrication infrastructure and may be fitted to LEDs in many existing devices.

With the advantage of very little or no loss of QD quantum yield (QY) in processing; this new approach affords reduced losses of quantum efficiency than when formulating the QDs directly into an LED encapsulation medium followed by re-flow soldering, which is a high temperature process. Because there is very little or no loss of quantum yield it is easier to color render and less binning is required. It has been shown that when formulating QDs directly into an encapsulation medium using prior art methods, color control is difficult due to QD re-absorption or loss of quantum yield and shifting of the photoluminescence (PL) maximum position during this process or in the proceeding process such as re-flow soldering. Moreover batch to batch, i.e. device to device, reproducibility is very difficult or impossible to achieve. By using prefabricated QD caps the color of the light emitted by the device is much easier to control and is much more reproducible.

In a preferred embodiment known amounts of QDs are incorporated and encapsulated within the cap before being placed on to an LEO. As a result, the migration of moisture and oxygen towards the QDs is eliminated or reduced, thereby eliminating or at least reducing these hurdles to industrial production.

It has been shown that once the QDs are fully encapsulated from oxygen within the cap they may withstand considerably higher temperatures than when incorporated directly into an LED.

Embodiments of the present invention provide a method of incorporating QDs into a cap by incorporating a population of semiconductor nanoparticles into a cap including or consisting essentially of an optically transparent medium and incorporating said nanoparticle-containing cap-medium onto a light emitting host.

There may be further provided a light emitting device including a primary light source LED with a cap containing a formulation comprising or consisting essentially of a population of semiconductor nanoparticles incorporated into the cap comprising or consisting essentially of an optically transparent medium, said nanoparticle-containing cap being on top of a host light emitting diode, which may emit a secondary light source by conversion of a proportion of the primary light source.

There may be still further provided a method of fabricating a light emitting device comprising or consisting essentially of a population of semiconductor nanoparticles in a discrete cap comprising or consisting essentially of an optically transparent medium, embedding said nanoparticle-containing medium which sits on top of a host light emitting diode being a primary light source such that said primary light source is in optical communication with said population of semiconductor nanoparticles within the cap.

Color rendering may be achieved by appropriately arranging QDs into layers or 'discs' within the well of the cap. Discrete layers may be deposited and cured in the well of the cap to form discs. These discs may be ordered in such a way as to maximize performance. By way of example, red cadmium free quantum dots (CFQDs) may absorb the photoluminescence of green CFQDs so that if the order of the color of the QDs in the light pass, i.e. the path followed by light emitted by the primary light source, is red followed by green then only a minimum amount of green light will be reabsorbed by the red layer.

By incorporating QDs into an optically transparent, preferably clear, stable bulk material to form the cap it is possible to protect the otherwise reactive QDs from the potentially damaging surrounding chemical environment. Moreover, by placing a number of QDs into a transparent cap, the ODs are subsequently more stable, than the free "naked" QDs, to the types of chemical, mechanical, thermal and photo-processing steps which are required, such as when employing QDs as color converting materials in a "QD-solid-state-LED" light emitting device.

Incorporating Quantum Dots into LED Caps

Figure 6:
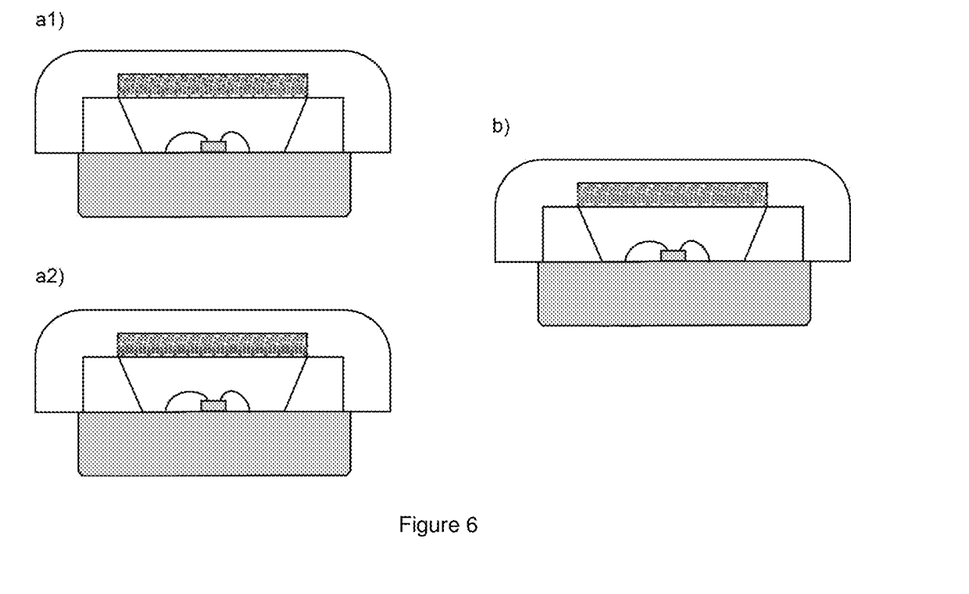
FIG. 6 shows three schematic representations of different configurations of QDs being incorporated into an LED cap in accordance with different preferred embodiments of the present invention; a1 and a2 depict combinations of red and green QD to emit white secondary light in which the differently colored QDs are mixed throughout the depth of the QD layer (a1) or provided in a series of layers, each layer containing a single type of QD (a2). In b) a single-colored QD has been used so that only one color (e.g. green) of secondary light will be emitted.

Considering the initial step of incorporating QDs into a cap for use in a light emitting device (e.g. an LED), a first option is to incorporate the QDs directly into the matrices of the cap material. A second option is to immobilize the QDs in the cap through physical entrapment (as shown in FIG. 3). Using these methods, a cap that contains just a single type of QD (e.g. one color) may be made by incorporating a single type of QD into the cap. Alternatively, a cap that contains two or more types of QD (e.g. two or more colors) may be constructed by incorporating a mixture of two or more types of QD (e.g. material and/or size) into the cap. Such caps may have combined QDs in any suitable ratio to emit any desirable color of secondary light following excitation by the primary light emitted by the primary light source (e.g. LED). This is exemplified in FIG. 6 below which schematically shows QD-cap light emitting devices including respectively: a1 and a2) multi-colored, multiple QD types in each cap such that white secondary light is emitted; and b) a cap such that each cap contains a single QD type emitting a single color, e.g. green.

In respect of the second option for incorporating QDs into LED-caps, the QDs may be immobilized in polymer caps through physical entrapment. For example, a solution of QDs in a suitable solvent (e.g. an organic resin) may be deposited into the well of the cap. Removal of the solvent or polymerization of the resin using any appropriate method typically results in the QDs becoming immobilized within the matrix of the cap. The QDs generally remain immobilized in the well of the cap unless the cap containing the QDs is re-suspended in a solvent (e.g. organic solvent) in which the QDs are freely soluble. Optionally, at this stage the outside of the cap may be sealed and thus the QDs protected from the surrounding environment, in particular oxygen.

As well as incorporating mixtures of QDs, layers of QDs may be deposited into the well of the cap. The layers may include or consist essentially of one or more types of QDs so that a cap which emits multi-colored light or single colored light as described above may be achieved. Furthermore, performance enhancements may be achieved by layering the different colored QDs in order of increasing bandgap along the light pass direction. In this configuration the red QDs may be the layer closest to the LED and the green QDs further away. This will result in a minimization of reabsorption losses of the red-dots absorbing the green photoluminescence.

Incorporating Quantum Dot-Caps onto LEDs

It is a significant advantage of embodiments of the present invention that quantum dot-cap (QD-caps) produced as described above may be incorporated on to commercially available LEDs simply by fitting on top of the LED. Thus, in a preferred embodiment of the present invention a nanoparticle-containing cap is fitted on to a host light emitting diode. The QD-cap-LED according to embodiments of the present invention thus provides a simple and straightforward way of facilitating the fabrication of next generation, higher performance light emitting devices using, as far as possible, standard commercially available materials and methods.

LED Cap Materials

Any existing commercially available LED encapsulant may be used as the bulk material defining the LED cap in connection with the various embodiments of the present invention. Preferred LED encapsulants include silicones, epoxies, (meth)acrylates, and other polymers, although it will be appreciated by the skilled person that further options are available, such as but not limited to silica glass, silica gel, siloxane, sol gel, hydrogel, agarose, cellulose, epoxy, polyether, polyethylene, polyvinyl, poly-diacetylene, polyphenylene-vinylene, polystyrene, polypyrrole, polyimide, polyimidazole, polysulfone, polythiophene, polyphosphate, poly(meth)acrylate, polyacrylamide, polypeptide, polysaccharide, and combinations thereof.

In a preferred embodiment the present invention provides a light-emitting device comprising or consisting essentially of a population of QDs incorporated into an optically transparent bulk material which is placed on to, preferably on top of, the host light emitting diode (LED) in such a way that it may be considered a 'cap' on the LED. The QDs within the optically transparent bulk material are in optical communication with a primary solid-state photon/light source (e.g. an LED, laser, arc lamp, or blackbody light source) such that, upon excitation by primary light from the primary light source the QDs within the optically transparent cap emit secondary light of a desired color. The required intensities and emission wavelengths of the light emitted from the device itself may be selected according to appropriate mixing of the color of the primary light with that of the secondary light(s) from the QDs within the cap produced from the down conversion of the primary light by the ODs. Moreover, the size (and thus emission) and number of each type of QD within the optically transparent cap may be controlled, as may the size, morphology and constituency of the optically transparent medium, such that subsequent mixing of the QD-containing media enables light of any particular color and intensity to be produced.

It will be appreciated that the overall light emitted from the device (i.e. the LED with the cap in place) may include or consist essentially of the light emitted from the QDs, i.e. just the secondary light, or a mixture of light emitted from the QDs and light emitted from the solid-state/primary light source, i.e. a mixture of the primary and secondary light. Color mixing of the QDs may be achieved either within the QD containing media or a mixture of differently colored optically transparent media (e.g. layers) with all the QDs within a specific medium being the same size/color (e.g. some layers containing all green QDs and others containing all red QDs).

The optically transparent cap may contain one or more type of semiconductor nanoparticles capable of secondary light emission upon excitation by primary light emitted by the primary light source (LED). It is preferred that the formulation of the bulk material forming the LED cap contains a population of semiconductor nanoparticles distributed within the bulk cap material on top of the LED.

The optically transparent bulk material from which the cap is made may contain any desirable number and/or type of semiconductor nanoparticles (quantum dots). Thus, the material may contain a single type of QD, e.g. exhibiting a specific emission, such that it emits monochromatic light of a predefined wavelength, i.e. color. The color of the emitted light may be adjusted by varying the type of QDs used, e.g. changing the size of the nanoparticle. Moreover, color control may also be achieved by incorporating different types of semiconductor nanoparticles, for examples QDs of different size and/or chemical composition, within the bulk material defining the optically transparent cap.

Advantages of using a QD-containing cap over direct addition of the QDs into the LED well containing, for example a silicone or epoxy encapsulant, include greater stability to air and moisture, greater stability to photo-oxidation and greater stability to mechanical processing. These increases in stability combine to provide in an overall increase in lifetime.

In the Comparative Example presented below a light emitting device according to embodiments of the present invention incorporating QD-caps on the LED performs significantly better than a light emitting device incorporating "naked" QDs embedded directly into the silicone of an LED encapsulant analogous to prior art methods.

Figure 2:
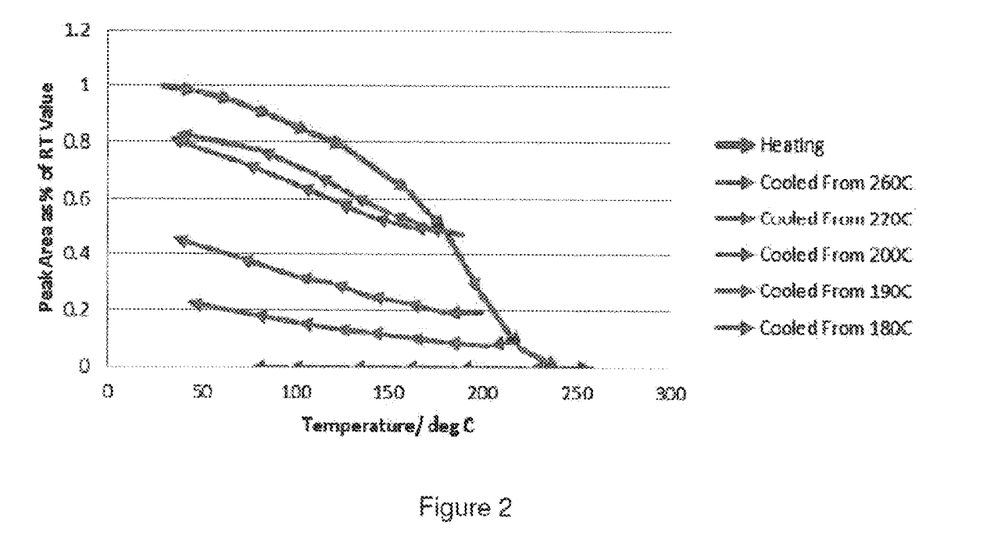
FIG. 2 is a graph of relative peak area for glass encapsulated QDs heated to various temperatures then cooled to close to room temperature.

Moreover, the devisors of the present invention have determined that, in various embodiments, encapsulating QDs from air in a suitable encapsulating medium which is then embedded within a standard LED resin enables the threshold temperature for irreversible temperature damage for the QD-containing resin to be increased from the temperature that the QDs can withstand to the temperature that the encapsulant can withstand. Typically, the upper temperature an encapsulated system can withstand and still recover from is around 190° C., after which reactions between air, if the encapsulation has failed, and/or the resin occur. FIG. 2 shows a graph of how QD photoluminescence peak area changes with temperature in a fully glass encapsulated system. It shows how the peak area decreases with increasing temperature and does not recover, or only partially recovers, once heated past a threshold temperature. In this case the threshold temperature was 190° C.

In a further aspect, embodiments of the present invention provide a light emitting device comprising or consisting essentially of an LED chip submerged in a first encapsulant and a formulation containing a population of semiconductor nanoparticles provided on said first encapsulant.

The LED chip is preferably submerged in the first encapsulant to a sufficient depth to ensure that the formulation containing the semiconductor nanoparticles is insulated from heat generated by the LED chip during operation, or at least to the extent that the lifetime of the QDs is not significantly reduced by exposure to heat generated by the LED chip. That is, heat generated by the LEDs is not a significant determinant of performance of the QDs in the device.

It is preferred that a layer of a sealing medium, e.g. a glass plate, is provided on the formulation containing the semiconductor nanoparticles to insulate said formulation from the surrounding atmosphere. While a thin glass plate is preferred, any suitable sealing medium may be used.

Any desirable type of semiconductor nanoparticle may be employed in the materials, methods and devices according to embodiments of the present invention. In a preferred embodiment, the nanoparticle contains ions, which may be selected from any desirable group of the periodic table, such as but not limited to group 11, 12, 13, 14, 15 or 16 of the periodic table. The nanoparticle may incorporate transition metal ions or d-block metal ions. It is preferred that the nanoparticles contain first and second ions with the first ion preferably selected from group 11, 12, 13 or 14 and the second ion preferably selected from group 14, 15 or 16 of the periodic table. The nanoparticles may contain one or more semiconductor material selected from the group consisting of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, and combinations thereof. Moreover, the nanoparticles may be binary, tertiary or quaternary core, core-shell or core-multi shell, doped or graded nanoparticles as are known to the skilled person.

In various embodiments of the present invention the semiconductor nanoparticles may be provided alone (I.e. the nanoparticles being embedded directly in the cap bulk material), or the nanoparticles may be contained in or associated with beads or beadlike architectures, or combinations thereof. That is, the nanoparticles may be dispersed directly into the cap bulk material, incorporated into a plurality of discrete microbeads which are then dispersed or embedded within said cap material, or a combination may be used.

The term "beads" is used for convenience and is not intended to impose any particular size or shape limitation. Thus, for example, the beads may be spherical but other configurations are possible, such as disc- or rod-like. Where reference is made herein to "microbeads" this is intended to refer to "beads" as defined above having a dimension on the micron scale. The beads are preferably formed from an optically transparent medium and are preferably provided in the form of a plurality of discrete, i.e. separate or distinct, microbeads. For the avoidance of doubt, reference to microbeads as being "discrete" is not intended to exclude composite materials formed by aggregations of microbeads since even in such materials each microbead retains its original bead-like structure despite being in contact with one or more other microbeads. By pre-loading small microbeads, which may range in size from 50 nm to 500 µm or more preferably 25 nm to 0.1 mm or more preferably still 20 nm to 0.5 mm in diameter, with QDs, then incorporating one or more of these QD-containing beads into an LED encapsulation material on a UV or blue LED, it enables the change, in a controllable and reproducible manner, of the color of the light emitted by the LED device. Moreover, it has been shown that this approach may be much simpler than attempting to directly incorporate the QDs directly into an LED encapsulate in terms of ease of color rendering, processing, and reproducibility and offers greater QD stability to photo-oxidation. This approach may lead to better processing; the QD-containing beads may be made to the same size as the currently employed YAG phosphor material which range from 10 to 100 µm and may thus be supplied to commercial manufacturers in a similar form to that of the current commercially used phosphor material. Moreover, the QD-containing beads are in a form that is compatible with the existing LED fabrication infrastructure.

The material from which the beads or microbeads are made is preferably optically transparent medium and may be made in the form of a resin, polymer, monolith, glass, sol gel, epoxy, silicone, (meth)acrylate or the like using any appropriate method. It is preferred that the resulting nanoparticle-containing bead is suitably compatible with the optically transparent encapsulating medium to enable the nanoparticle-containing beads to be embedded within the encapsulant such that the chemical and physical structure of the resulting composite material (i.e. the encapsulant with nanoparticle containing beads embedded therein) remains substantially unchanged during further processing to incorporate the composite into a light emitting device and during operation of the resulting device over a reasonable lifetime for the device. Suitable bead materials include: poly(methyl(meth)acrylate) (PMMA); poly(ethylene glycol dimethacrylate)(PEGMA); poly(vinyl acetate)(PVA); poly(divinyl benzene)(PDVB); poly(thioether); silane monomers; epoxy polymers; and combinations thereof. A particularly preferred bead material which has been shown to exhibit excellent processibility and light emitting device performance comprises or consists essentially of a copolymer of PMMA, PEGMA and PVA. Other preferred bead materials employ polystyrene microspheres with divinyl benzene and a thiol co-monomer; silane monomers (e.g. 3-(trimethoxysilyl)propylmethacrylate (TMOPMA) and tetramethoxy silane (TEOS)); and an epoxy polymer (e.g. Optocast™ 3553 from Electronic Materials, Inc., USA).

By incorporating at least some of the QDs into an optically transparent, preferably clear, stable bead material the otherwise reactive QDs may be protected from the potentially damaging surrounding chemical environment. Moreover, by placing a number of QDs into a single bead, for example in the size range from 20 nm to 500 µm in diameter, the subsequent QD-bead may be more stable, than free or "naked" QDs, to the types of chemical, mechanical, thermal and photo-processing steps which are required to incorporate QDs in most commercial applications, such as when employing quantum dots as down converters in a "QD-solid-state-LED" light emitting device.

The formulation according to embodiments of the present invention may contain a population of semiconductor nanoparticles distributed across a plurality of beads embedded within the optically transparent encapsulating medium. Any desirable number of beads may be embedded, for example, the encapsulating medium may contain 1 to 10,000 beads, more preferably 1 to 5000 beads, and most preferably 5 to 1000 beads.

Some or all of the nanoparticle-containing microbeads may include a core comprising or consisting essentially of a first optically transparent material and one or more outer layers or shells of the same or one or more different optically transparent materials deposited on said core. Nanoparticles may be confined to the core region of the microbeads or may be dispersed throughout the core and/or one or more of the shell layers of the microbeads.

Advantages of QD-containing beads over free QDs may include greater stability to air and moisture, greater stability to photo-oxidation and greater stability to mechanical processing. Moreover, by pre-loading small microbeads, which may range in size from a few 50 nm to 500 µm, with QDs then incorporating one or more of these QD-containing beads into the encapsulating medium on a UV or blue LED, it enables the change, in a controllable and reproducible manner, of the color of the light emitted by the LED-based light emitting device.

Any appropriate method may be employed to produce the semiconductor nanoparticles employed in the various embodiments of the present invention. That being said, it is preferred that said semiconductor nanoparticles are produced by converting a nanoparticle precursor composition to the material of the nanoparticles in the presence of a molecular cluster compound under conditions permitting seeding and growth of the nanoparticles on the cluster compound. Conveniently, the nanoparticles incorporate first and second ions and the nanoparticle precursor composition comprises or consists essentially of first and second nanoparticle precursor species containing the first and second ions respectively which are combined, preferably in the presence of a molecular cluster compound, as exemplified below in Synthetic Methods 1 and 2. The first and second precursor species may be separate species in the precursor composition or may form part of a single molecular species containing both the first and second ions. The method may employ the methodology set out in the applicant's co-pending European patent application (publication no. EP1743054A) and U.S. Pat. No. 7,803,423, the entire disclosure of each of which is incorporated by reference herein. The molecular cluster compound may contain third and fourth ions. At least one of said third and fourth ions is preferably different to said first and second ions contained in the first and second nanoparticle precursor species respectively. The third and fourth ions may be selected from any desirable group of the periodic table, such as but not limited to group 11, 12, 13, 14, 15 or 16 of the periodic table. The third and/or fourth ion may be a transition metal ion or a d-block metal ion. Preferably the third ion is selected from group 11, 12, 13 or 14 and the fourth ion is selected from group 14, 15 or 16 of the periodic table. By way of example, the molecular cluster compound may incorporate third and fourth ions from groups 12 and 16 of the periodic table respectively and the first and second ions derived from the first and second nanoparticle precursor species may be taken from groups 13 and 15 of the periodic table respectively as in Synthetic Method 2. Accordingly, the methods according to the first and second aspects of the present invention may employ methodology taken from the applicant's co-pending International patent application (publication no. WO/2009/016354), the entire disclosure of which is incorporated by reference herein.

It will be appreciated that during the reaction of the first and second nanoparticle precursor species, the first nanoparticle precursor species may be added in one or more portions and the second nanoparticle precursor species may be added in one or more portions. The first nanoparticle precursor species is preferably added in two or more portions. In this case, it is preferred that the temperature of a reaction mixture containing the first and second nanoparticle precursor species is increased between the addition of each portion of the first precursor species. Additionally or alternatively, the second nanoparticle precursor species may be added in two or more portions, whereupon the temperature of a reaction mixture containing the first and second nanoparticle precursor species may be increased between the addition of each portion of the second precursor species.

The coordination about the final inorganic surface atoms in any core, core-shell or core-multi shell, doped or graded nanoparticle is typically incomplete, with highly reactive non-fully coordinated atoms acting as "dangling bonds" on the surface of the particle, which may lead to particle agglomeration. This problem is typically overcome by passivating (capping) the "bare" surface atoms with protecting organic groups.

In many cases, the capping agent is the solvent in which the nanoparticles have been prepared, and includes or consists essentially of a Lewis base compound, or a Lewis base compound diluted in an inert solvent such as a hydrocarbon. There is a lone pair of electrons on the Lewis base capping agent that are capable of a donor type coordination to the surface of the nanoparticle and include mono- or multi-dentate ligands such as phosphines (trioctylphosphine, triphenylphosphine, t-butylphosphine etc.), phosphine oxides (trioctylphosphine oxide, triphenylphosphine oxide etc.), alkyl phosphonic acids, alkyl-amines (hexadecylamine, octylamine etc.), aryl-amines, pyridines, long chain fatty acids, and/or thiophenes but is, as one skilled in the art will know, not restricted to these materials.

In addition to the outermost layer of organic material or sheath material (capping agent) helping to inhibit nanoparticle-nanoparticle aggregation, this layer may also protect the nanoparticles from their surrounding electronic and chemical environments, and provide a means of chemical linkage to other inorganic, biological or organic material, whereby the functional group is pointing away from the nanoparticle surface and is available to bond/react/interact with other available molecules, such as amines, alcohols, carboxylic acids, esters, acid chloride, anhydrides, ethers, alkyl halides, amides, alkenes, alkanes, alkynes, allenes, amino acids, azides, groups etc. but is, as one skilled in the art will know, not limited to these functionalized molecules. The outermost layer (capping agent) of a QD may also include or consist essentially of a coordinated ligand that possess a functional group that is polymerizable and may be used to form a polymer layer around the nanoparticle. The outermost layer may also include or consist essentially of organic units that are directly bonded to the outermost inorganic layer such as via a disulphide bond between the inorganic surface (e.g. ZnS) and a thiol capping molecule. These may also possess additional functional group(s), not bonded to the surface of the particle, which may be used to form a polymer around the particle, or for further reaction/interaction/chemical linkage.

The inventors have determined that it is possible to take QDs capped with polymerisable ligands or a capping agent, such as an amine or phosphine, and incorporate these QDs into a polymer, which may be embedded within a cap made of a bulk material which may be provided on a solid-state LED chip to form an improved type of QD-based light emitting device.

BRIEF DESCRIPTION OF THE DRAWINGS

Embodiments of the present invention are illustrated with reference to the following non-limiting examples and figures in which.

EXAMPLES

Examples 1 to 3 below describe the preparation of QD-containing formulations for use in the fabrication of new, improved QD-based light emitting devices in accordance with embodiments of the present invention. In the Comparative Example a device in accordance with embodiments of the present invention is tested against a device based on prior art principles using the same type of QDs to compare the performance of the two devices. Two methods for producing QDs suitable for incorporation into said formulations are first set out in the Synthetic Methods section below.

Synthetic Methods
Method 1

CdSe/ZnS hexadecylamine (HDA)-capped quantum dots were prepared as described below for subsequent processing into a quantum-dot-containing formulation for use in the fabrication of a light emitting device in accordance with embodiments of the present invention.

Preparation of CdSe-HDA Capped Core Quantum Dots

HDA (500 g) was placed in a three-neck round bottomed flask and dried and degassed by heating to 120° C. under a dynamic vacuum for >1 hour. The solution was then cooled to 60° C. To this was added 0.718 g of $[HNEt_3]_4$-$[Cd_{10}Se_4(SPh)_{16}]$ (0.20 mmols). In total 42 mmols, 22.0 ml of TOPSe and 42 mmols, (19.5 ml, 2.15M) of $Me_2Cd.TOP$ was used. Initially 4 mmol of TOPSe and 4 mmols of $Me_2Cd.TOP$ were added to the reaction at room temperature and the temperature increased to 110° C. and allowed to stir for 2 hours. The reaction was a deep yellow color, the temperature was progressively increased at a rate of ~1° C./5 min with equimolar amounts of TOPSe and $Me_2Cd.TOP$ being added dropwise. The reaction was stopped when the PL emission maximum had reached ~600 nm, by cooling to 60° C. followed by addition of 300 ml of dry ethanol or acetone. This produced a precipitation of deep red particles, which were further isolated by filtration. The resulting CdSe particles were recrystallized by re-dissolving in toluene followed by filtering through Celite followed by re-precipitation from warm ethanol to remove any excess HDA, selenium or cadmium present. This produced 10.10 g of HDA capped CdSe nanoparticles. Elemental analysis C=20.88, H=3.58, N=1.29, Cd=46.43%. Max PL=585 nm, FWHM=35 nm. 38.98 mmols, 93% of $Me_2Cd$ consumed in forming the QDs.

Preparation of CdSeIZnS-HDA Capped Nanoparticles

HDA (800 g) was placed in a three neck round-bottom flask, dried and degassed by heating to 120° C. under a dynamic vacuum for >1 hour. The solution was then cooled to 60° C., to this was added 9.23 g of CdSe nanoparticles that have a PL maximum emission of 585 nm. The HDA was then heated to 220° C. To this was added by alternate dropwise addition a total of 20 ml of 0.5M $Me_2Zn.TOP$ and 0.5M, 20 ml of sulfur dissolved in octylamine. Three alternate additions of 3.5, 5.5 and 11.0 ml of each were made, whereby initially 3.5 ml of sulfur was added dropwise until the intensity of the PL maximum was near zero. Then 3.5 ml of $Me_2Zn.TOP$ was added dropwise until the intensity of the PL maximum had reached a maximum. This cycle was repeated with the PL maximum reaching a higher intensity with each cycle. On the last cycle, additional precursor was added once the PL maximum intensity been reached until it was between 5-10% below the maximum intensity, and the reaction was allowed to anneal at 150° C. for 1 hour. The reaction mixture was then allowed to cool to 60° C. whereupon 300 ml of dry "warm" ethanol was added which resulted in the precipitation of particles. The resulting CdSe—ZnS particles were dried before re-dissolving in toluene and filtering through Celite followed by re-precipitation from warm ethanol to remove any excess HDA. This produced 12.08 g of HDA capped CdSe—ZnS core-shell nanoparticles. Elemental analysis C=20.27, H=3.37, N=1.25, Cd=40.11, Zn=4.43%; Max PL 590 nm, FWHM 36 nm.

Method 2

InP QDs were prepared as described below which may then be processed into a quantum-dot-containing formulation for use in the fabrication of a light emitting device in accordance with embodiments of the present invention.

Preparation of InP Core Quantum Dots (500-700 nm Emission)

Di-butyl ester (100 ml) and myristic acid (10.0627 g) were placed in a three-neck flask and degassed at 70° C. under vacuum for one hour. After this period, nitrogen was introduced and the temperature increased to 90° C. ZnS molecular cluster $[Et_3NH_4][Zn_{10}S_4(SPh)_{16}]$ (4.7076 g) was added and the mixture allowed to stir for 45 minutes. The temperature was then increased to 100° C. followed by the dropwise addition of $In(MA)_3$ (1M, 15 ml) followed by $(TMS)_3P$ (1M, 15 ml). The reaction mixture was allowed to stir while increasing the temperature to 140° C. At 140° C., further dropwise additions of $In(MA)_3$ (1M, 35 ml) (left to stir for 5 minutes) and $(TMS)_3P$ (1M, 35 ml) were made. The temperature was then slowly increased to 180° C. and further dropwise additions of $In(MA)_3$ (1M, 55 ml) followed by $(TMS)_3P$ (1M, 40 ml) were made. By addition of the precursor in the manner above nanoparticles of InP could be grown with the emission maximum gradually increasing from 520 nm up to 700 nm, whereby the reaction may be stopped when the desired emission maximum has been obtained and left to stir at this temperature for half an hour. After this period, the temperature was decreased to 160.0 and the reaction mixture was left to anneal for up to 4 days (at a temperature between 20-40° C. below that of the reaction). A UV lamp was also used at this stage to aid in annealing.

The nanoparticles were isolated by the addition of dried degassed methanol (approx. 200 ml) via cannula techniques. The precipitate was allowed to settle and then methanol was removed via cannula with the aid of a filter stick. Dried degassed chloroform (approx. 10 ml) was added to wash the solid. The solid was left to dry under vacuum for 1 day. This produced 5.60 g of InP core nanoparticles. Elemental analysis: max PL=630 nm, FWHM=70 nm.

Post-Operative Treatments

The quantum yields of the InP QDs prepared above were increased by washing with dilute HF acid. The dots were dissolved in anhydrous degassed chloroform (~270 ml). A 50 ml portion was removed and placed in a plastic flask, flushed with nitrogen. Using a plastic syringe, the HF solution was made up by adding 3 ml of 60% w/w HF in water and adding to degassed THF (17 ml), The HF was added dropwise over 5 hours to the InP dots, After addition was complete the solution was left to stir overnight. Excess HF was removed by extracting through calcium chloride solution in water and drying the etched InP dots. The dried dots were re-dispersed in 50 ml chloroform for future use. Max 567 nm, FWHM 60 nm. The quantum efficiencies of the core materials at this stage range from 25-90%.

Growth of a ZnS Shell to Provide InP/ZnS Core/Shell Quantum Dots

A 20 ml portion of the HF etched InP core particles was dried down in a 3-neck flask, 1.3 g myristic acid and 20 ml di-n-butyl sebacate ester was added and degassed for 30 minutes. The solution was heated to 200° C. then 1.2 g anhydrous zinc acetate was added and 2 ml 1M $(TMS)_2S$ was added dropwise (at a rate of 7.93 ml/hr) after addition was complete the solution was left to stir. The solution was kept at 200° C. for 1 hour then cooled to room temperature. The particles were isolated by adding 40 ml of anhydrous degassed methanol and centrifuged. The supernatant liquid was disposed of and to the remaining solid 30 ml of anhydrous degassed hexane was added. The solution was allowed to settle for 5 hours and then re-centrifuged. The supernatant liquid was collected and the remaining solid was discarded, PL emission peak Max=535 nm, FWHM=65 nm, The quantum efficiencies of the nanoparticle core/shell materials at this stage ranged from 35-90%.

Example 1

An LED cap machined from solid polymethylmethacrylate (PMMA) was washed by suspending in water/detergent mix and sonicating for 10 minutes. This was followed by a water wash and finally a methanol wash. Each wash was performed by sonicating in the prescribed solvent for 10 minutes. The cap was blown dry using compressed air. Inside a nitrogen filled glovebox, 3 microlitres of a QD/acrylate resin mixture was dispensed into the LED cap well using a micropipette. The resin was then cured by exposing to UV light from a 365 nm LED (250 mW/cm$^2$) for 180 seconds. The cap was turned over and an identical curing cycle repeated.

A piece of 3M 360M encapsulating barrier film was then applied to the cap to seal the QD-containing resin. This was done as follows: 2 microlitres of Optocast 3553 UV curing epoxy was deposited on top of the QD-containing resin and spread over the whole face evenly. A piece of 3M 360M film cut to the same dimensions as the face to be encapsulated was deposited onto the Optocast 3553 resin and pressed in place firmly. The Optocast 3553 was cured by exposing to UV light from a 365 nm LED (250 mW/cm$^2$) for 20 seconds. The completed cap was stored overnight for the curing of the resins to complete.

Example 2

Quantum Dot-Cap Light Emitting Device Fabrication

The finished cap as described in Example 1 is used in conjunction with an LED in the following fashion. Inside a nitrogen filled glovebox, 2 microlitres of Optocast 3553 UV curing epoxy was deposited onto the 3M 360M encapsulant film of the finished cap as described in Example 1. A silicone filled blue (3528TOP package) LED is then placed into the cap such that the LED is facing the cap and the excess Optocast 3553 is squeezed out as the LED is pushed into place. In this configuration the cap and LED are exposed to UV light from a 365 nm LED (250 mW/cm$^2$) for 20 seconds to cure the Optocast 3553. The cap and LED are then turned over and re-exposed to UV light under the same conditions and timing to further cure the Optocast 3553. The completed cap-LED is left inside the glove box overnight for the curing of the Optocast 3553 to complete. Optionally this may be accelerated by baking the cap-LED at 50° C. for 12 hours.

Example 3

QD-LED Incorporating Spacer Between LED Chip and QD-Containing Medium

Figure 7:
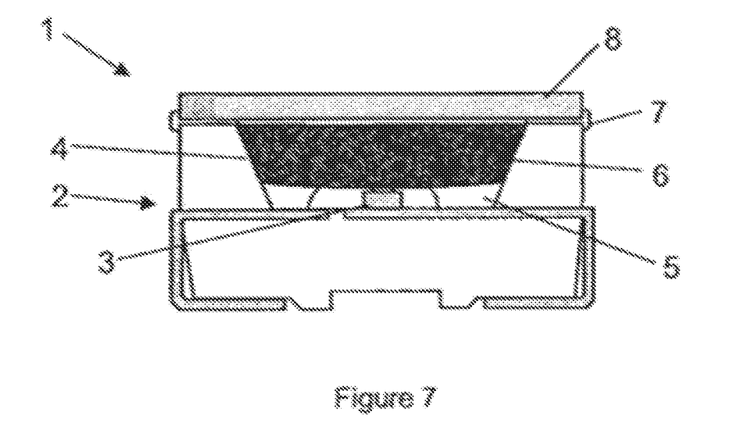
FIG. 7 is a schematic representation of a QD-based light emitting device according to various embodiments of the present invention.

The direct acrylate LED has a multilayer structure as described in FIG. 7. A light emitting device 1 comprising a conventional LED package 2 with a standard LED chip 3. Directly on top of the LED chip 3 within the LED well 4 is provided a sufficient volume of a commercially available silicone resin 5 so as to cover and submerge the LED chip 3. A sufficient volume of a QD-monomer mixture 6 is provided on top of the silicone layer 5 so as to substantially fill the LED well 4. Since the silicone resin 5 submerges the LED chip 3 there is a space between the chip 3 and the QD-monomer mixture 6 that is filled with the silicone resin 5. In this way, the QD-containing mixture 6 is insulated from the potentially harmful high temperatures generated by the chip 3 during operation. A UV curing epoxy resin 7 is provided around the periphery of the opening to the LED well 4, upon which is provided a thin layer of an encapsulating material 8, such as glass. The epoxy resin 7 and QD-monomer mixture 6 are then exposed to UV radiation as described above to cure the resin 7 and seal the device 1, and to polymerize and crosslink the QD-monomer mixture 6.

Procedure for Fabrication

The different layers in the LED are processed in the following order: 1. Silicone; 2. QD-acrylate; 3. Encapsulation layer. Detailed instructions for fabrication are given in the following sections.

1. Silicone Layer

Weigh out 0.5 g of SCR1011A into a clean 10 mL glass vial. Add 0.5 g SCR1011B in the glass vial containing SCR1011A. Mix thoroughly using a glass rod. Degas resulting mixture by applying a vacuum for 30 minutes. Dispense 1 .µL into each LED package in an LED frame. Take the LED frame into the glove box. Heat frame on a hot plate set to 170° C. for 3 hours. After 3 hours at 170° C., remove from heat and leave to cool to room temperature.

2. CFQD-Acrylate Layer

Inside the glove box, using micropipette dispense 1.54, of the CFQD-acrylate solution into each of the LED packages on the curing stage. Transfer curing stage to rotating plate and set stage rotating (approx. 6 rpm). Illuminate sample using Hamamatsu LC-L2 365 nm UV curing LED system for 3 minutes (intensity 250 mW/cm$^2$). Allow to stand for 24 hours for polymerization to complete.

3. Encapsulation Layer

Using a micropipette (Gilson P20) with yellow tips dispense 1.5 µL of Optocast 3553-UTF. For each LED place a pre-cut piece of glass (or other encapsulant material) on top of the Optocast 3553-UTF. If encapsulant material is GX-P-F this is preferably applied with side A facing upwards. If encapsulant material is 3M HB-300M or HB-360M this is preferably applied with the shiny side down. Transfer curing stage to rotating plate and set stage rotating (approx. 6 rpm). Illuminate sample using Hamamatsu LC LC-L2 365 nm UV curing LED system for 20 seconds (intensity 250 mW/cm$^2$). Allow to stand for 24 hours for polymerization to complete.

Comparative Example

Many QD containing LEDs of different configurations have been compared. The configurations of the LED are QDs in resin (acrylate or silicone) in the well of the LED, QDs in resin (acrylate or silicone) in the well of the LED with and without an encapsulation barrier film as described above in Example 3 and QDs in the well of the LED cap on top of the LED as described above in Examples 1 and 2.

QD-Cap vs. Direct Addition QD-LED

Figure 8:
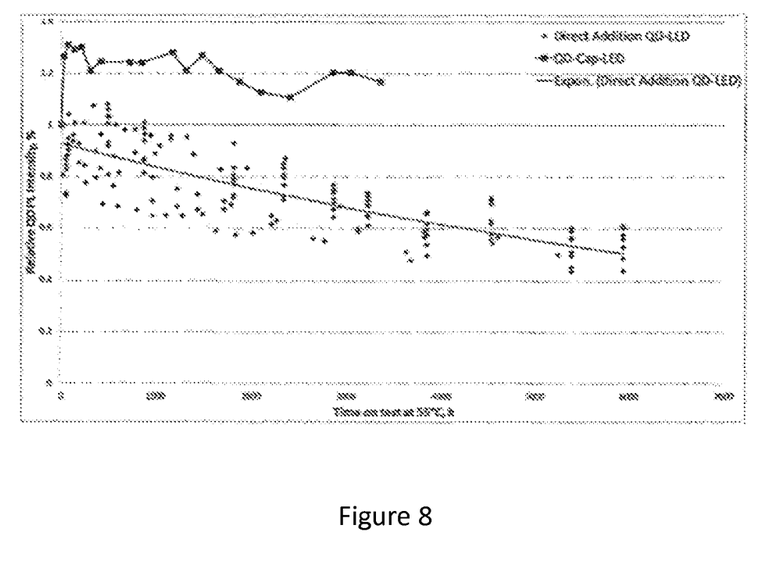
FIG. 8 is a plot of QD peak intensity against time for LEDs incorporating direct addition QDs (diamonds, lower points/trend line) and QD-Caps relative to the initial peak intensity.

Samples using the same batch of cadmium-free QDs (CFQDs) were prepared as described above and put on test in air powering the LEDs with a forward current of 20 m A at an environment temperature of 55° C. Periodically the spectral radiant flux of the LEDs was measured and the intensity of the QD PL peak intensity plotted against time on test relative to the initial QD PL peak intensity. This data is presented in FIG. 8. A large number of direct addition LEDs have been tested and data for 14 of the longest living samples has been compared to the first LED cap put on test. This data shows that the LEDs having the QDs added directly into the well of the LED and including a spacer layer of silicone between the QD-containing medium and the LED chip perform better than many prior art devices, presumably because the QDs are to some extent shielded or insulated from the high temperatures generated by the LED chip during operation. The date also shows that use of the QD-cap provides an even greater improvement in terms of the stability and lifetime of the LED as compared to both prior art devices and the direct addition LED.

The invention claimed is:

1. A cap configured to integrate with a lighting device having a primary light source, the cap comprising:
    a bulk material,
    a well region, and
    a suspension of semiconductor nanoparticles in photo-curable polymer disposed within the well region, wherein
    the cap is configured so that when the cap is integrated with the lighting device the semiconductor nanoparticles are in optical communication with the primary light source and the nanoparticles are insulated from air by a seal between the cap and the lighting device.

2. A cap according to claim 1, wherein the well region is at least partly defined by a recess in the cap.

3. A cap according to claim 1, wherein the well region is at least partly defined by an area of the cap bulk material.

4. A cap according to claim 1, wherein the well region is defined in part by a recess in the cap and in part by an area of the cap bulk material.

5. A cap according to claim 1, wherein the well region of the cap has at least one boundary that is configured, such that in use, the boundary is approximately aligned with a boundary of a region of the light emitting device exposed to light emitted by said primary light source.

6. A cap according to claim 1, wherein the cap bulk material comprises a material selected from the group consisting of a silicone, an epoxy, a silica glass, a silica gel, a siloxane, a sol gel, a hydrogel, an agarose, a cellulose, a polyether, a polyethylene, a polyvinyl, a poly-diacetylene, a polyphenylenevinylene, a polystyrene, a polypyrrole, a polyimide, a polyimidazole, a polysulfone, a poly thiophene, a polyphosphate, a poly(meth)acrylate, a polyacrylamide, a polypeptide, a polysaccharide, and combinations thereof.

7. A cap according to claim 1, wherein said semiconductor nanoparticles contain ions selected from the group consisting of groups 11, 12, 13, 14, 15 and 16 of the periodic table, or said semiconductor nanoparticles contain one or more types of transition metal ion or d-block metal ion.

8. A cap according to claim 1, wherein said semiconductor nanoparticles contain one or more semiconductor material selected from the group consisting of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe, and combinations thereof.

9. A cap according to claim 1, wherein the semiconductor nanoparticles are incorporated into a plurality of discrete microbeads.

10. A light emitting device comprising: a primary light source and a cap configured to integrate with a lighting device having a primary light source, wherein the cap comprises,
    a bulk material,
    a well region, and
    a suspension of semiconductor nanoparticles in photo-curable polymer disposed within the well region, wherein
    the cap is configured so that when the cap is integrated with the lighting device the semiconductor nanoparticles are in optical communication with the primary light source and the nanoparticles are insulated from air by a seal between the cap and the lighting device.

11. A cap according to claim 1, wherein said primary light source is selected from the group consisting of a light emitting diode, a laser, an arc lamp, and a blackbody light source.

12. A method of fabricating a light emitting device cap configured to integrate with a light emitting device having a primary light source, the method comprising:
    providing a cap formed of bulk material, configured to integrate with the light emitting device, and having a well region;
    providing a suspension of semiconductor nanoparticles in a photo-curable polymer
    depositing said suspension into said well region of the cap; and
    curing the photo-curable polymer.

13. A method according to claim 12, wherein said formulation is cured after deposition of the formulation into said well region of the cap.

14. A method according to claim 12, wherein at least one further semiconductor nanoparticle-containing formulation is deposited into said well region after deposition of said formulation of semiconductor nanoparticles.

15. A method according to claim 14, wherein said formulations contain populations of semiconductor nanoparticles which differ in respect of the size and/or composition of the semiconductor nanoparticles present in the formulations.

16. A method of fabricating a semiconductor nanoparticle-based light emitting device, the method comprising:
    providing a lighting device comprising a primary light source,
    providing a cap configured to integrate with the lighting device, the cap comprising a bulk material, a well region, and a suspension of semiconductor nanoparticles in a photo-curable polymer disposed within the well region,
    integrating the cap with the lighting device such that the semiconductor nanoparticles are in optical communication with the primary light source and the nanoparticles are insulated from air by a seal between the cap and the lighting device.

17. A method according to claim 16, wherein said cap is fabricated by depositing a formulation incorporating said semiconductor nanoparticles into said well region of the cap before integrating the cap with the lighting device.

* * * * *